United States Patent
Berg et al.

(10) Patent No.: US 9,306,111 B2
(45) Date of Patent: Apr. 5, 2016

(54) SEMICONDUCTOR MATERIAL AND METHOD OF PRODUCTION

(75) Inventors: Dominik Berg, Wadern-Dagstuhl (DE);
Alex Redinger, Luxembourg (LU);
Phillip Dale, Luxembourg (LU);
Susanne Siebentritt, Luxembourg (LU)

(73) Assignees: UNIVERSITE DU LUXEMBOURG, Luxembourg (LU); TDK CORPORATION, Tokyo (JP)

( * ) Notice: Subject to any disclaimer, the term of this patent is extended or adjusted under 35 U.S.C. 154(b) by 142 days.

(21) Appl. No.: 13/988,302

(22) PCT Filed: Nov. 18, 2011

(86) PCT No.: PCT/EP2011/070436
§ 371 (c)(1),
(2), (4) Date: Jun. 21, 2013

(87) PCT Pub. No.: WO2012/066116
PCT Pub. Date: May 24, 2012

(65) Prior Publication Data
US 2013/0269783 A1    Oct. 17, 2013

(30) Foreign Application Priority Data

Nov. 18, 2010 (LU) ......................... 91754

(51) Int. Cl.
| H01L 21/00 | (2006.01) |
| H01L 31/00 | (2006.01) |
| H01L 31/18 | (2006.01) |
| C23C 14/06 | (2006.01) |
| C23C 14/58 | (2006.01) |
| C25D 5/10 | (2006.01) |
| C25D 5/50 | (2006.01) |
| H01L 31/032 | (2006.01) |

(52) U.S. Cl.
CPC ........ *H01L 31/1864* (2013.01); *C23C 14/0623* (2013.01); *C23C 14/5866* (2013.01); *C25D 5/10* (2013.01); *C25D 5/50* (2013.01); *H01L 31/0326* (2013.01); *Y02E 10/50* (2013.01)

(58) Field of Classification Search
CPC ............ H01L 31/0326; H01L 31/0327; H01L 31/186; H01L 31/1864; H01L 31/1828; H01L 31/1832; H01L 31/1836; C23C 14/0623; C23C 14/5866
See application file for complete search history.

(56) References Cited

U.S. PATENT DOCUMENTS

2011/0094557 A1* 4/2011 Mitzi et al. ............... 136/244

OTHER PUBLICATIONS

Ahn et al., "Determination of Band Gap Energy ($E_g$) of $Cu_2ZnSnSe_4$ Thin Films: On the Discrepancies of Reported Band Gap Values," *Applied Physics Letters*, 97, 021905 (2010), 3 pp.
Araki et al., "Preparation of $Cu_2ZnSnSe_4$ Thin Films by Sulfurization of Stacked Metallic Layers," *Thin Solid Films*, 517 (2008), pp. 1457-1460.

(Continued)

*Primary Examiner* — Eli Mekhlin
(74) *Attorney, Agent, or Firm* — Foley & Lardner LLP

(57) ABSTRACT

A method of manufacturing $(Ag_xCu_{1-x})_2ZnSn(S_ySe_{1-y})_4$ thin films, the method comprising: providing a thin film comprising Ag and/or Cu, the thin film further comprising Zn and annealing the thin film in an atmosphere comprising S and/or Se, and further comprising Sn.

13 Claims, 5 Drawing Sheets a)

b)

c)

d)

(56) References Cited

OTHER PUBLICATIONS

Friedlmeier et al., "Heterojunctions based on $Cu_2ZnSnS_4$ and $Cu_2ZnSnSe_4$ Thin Films," *Proceedings of the 14th European Photovoltaic Specialists Conference, Barcelona*, (1997), pp. 1242-1245.
Katagiri et al., "Enhanced Conversion Efficiencies of $Cu_2ZnSnS_4$-Based Thin Film Solar Cells by Using Preferential Etching Technique," *Applied Physics Express*, 1, 041201 (Apr. 4, 2008), 2 pp.
Katagiri et al., "Preparation and Evaluation of $Cu_2ZnSnS_4$ Thin Films by Sulfurization of E-B Evaporated Precursors," *Solar Energy Materials and Solar Cells*, 49 (1997). pp. 407-414.
Lewis, "Toward Cost-Effective Solar Energy Use," *Science*, 315, 798 (Feb. 9, 2007), pp. 798-801.
Piacente et al., "Sublimation Study of the Tin Sulphides $SnS_2$, $Sn_2S_3$ and SnS," *Journal of Alloys and Compounds*, 177 (May 28, 1991), pp. 17-30.
Probst et al., "New Developments in $Cu(In,Ga)(S, Se)_2$ Thin Film Modules Formed by Rapid Thermal Processing of Stacked Elemental Layers," *Solar Energy Materials and Solar Cells*, 90 (Aug. 28, 2006), pp. 3115-3123.
Redinger et al., "Coevaporation of $Cu_2ZnSnSe_4$ Thin Films," *Applied Physics Letters*, 97, 092111 (Sep. 2, 2010), 3 pp.
Schubert et al., "$Cu_2ZnSnS_4$ Thin Film Solar Cells by Fast Coevaporation," *Progress in Photovoltaics: Res. and Appl.*, (Jan. 11, 2010), 4 pp.
Scragg et al., "A 3.2% Efficient Kesterite Device from Electrodeposited Stacked Elemental Layers," *Journal of Electroanalytical Chem.*, 646 (Jan. 18, 2010), pp. 52-59.
Scragg, "Studies of $Cu_2ZnSnS_4$ Films Prepared by Sulfurisation of Electrodeposited Precursors," Ph.D. Thesis, University of Bath (England) (May 2010), 262 pp.
Scragg et al., "Synthesis and Characterization of $Cu_2ZnSnS_4$ Absorber Layers by an Electrodeposition-Annealing Route," *Thin Solid Films*, 517 (Nov. 8, 2009), pp. 2481-2484.
Todorov et al., "High-Efficiency Solar Cell with Earth-Abundant Liquid-Processed Absorber," *Advanced Energy Materials*, 22 (2010), pp. 1-4.
Wang et al., "Thermally Evaporated $Cu_2ZnSnS_4$ Solar Cells," *Applied Physics Letters*, 97, 143508 (Oct. 5, 2010), 3 pp.
Weber et al., "Multi-Stage Evaporation of $Cu_2ZnSnS_4$ Thin Films," *Thin Solid Films*, 517 (Nov. 8, 2009), pp. 2524-2526.
Weber et al., "On the Sn loss from Thin Films of the Material System Cu—Zn—Sn—S in High Vacuum," *Journal of Applied Physics*, 107, 013516 (Jan. 12, 2010), 6 pp.
Weber, "Wachstum von Dunnschichten des Materialsystems Cu—Zn—Sn—S," Ph.D. Thesis, Helmholtz Zentrum Berlin (Germany) (Oct. 23, 2009), 153 pp.
Zocchi et al., "Sublimation Enthalpy of Tin Monoselenide," *Journal of Materials Science Letters*, 14 (1995), pp. 235-237.

\* cited by examiner

SEMICONDUCTOR MATERIAL AND METHOD OF PRODUCTION

FIELD OF THE INVENTION

The present invention relates to a method of manufacturing semiconductor thin films. In particular, the present invention relates to a method of annealing such thin films. More particularly, it relates to the manufacturing of $(Ag_xCu_{1-x})_2ZnSn(S_ySe_{1-y})_4$ thin films, wherein x and y can be selected between 0 and 1.

TECHNICAL BACKGROUND OF THE INVENTION

A $Cu_2ZnSn(S_ySe_{1-y})_4$ absorber layer is considered the leading candidate to replace a $Cu(In,Ga)(S,Se)_2$ absorber layer in thin films solar cells, because it only contains cheap, and abundant elements. $Cu_2ZnSn(S_ySe_{1-y})_4$ solar cells have reached power conversion efficiencies of 9.7%, clearly showing the potential of the material (Todorov et al., Adv. Mater., 2010, 22, 1-4).

$Cu_2ZnSn(S_ySe_{1-y})_4$ thin films for solar cell applications can be produced by a variety of different techniques. For the production of thin films a large number of different deposition techniques are used (e.g. evaporation techniques, sputtering, E-beam, electrodeposition, spray pyrolisis, photo-chemical deposition, spin coating, iodine transport method, printing, pulsed laser deposition). A first possibility is to deposit all elements or binary compounds at elevated temperatures such that the absorber is formed in one step. A further technique foresees that all elements or binary compounds are deposited at once (at room or elevated temperature) and then heated to re-crystallize. Finally, all elements or binary compounds may be deposited sequentially, and then heated to intermix and crystallize.

In some cases the $Cu_2ZnSn(S_ySe_{1-y})_4$ semiconductor compound is spontaneously formed on a heated substrate (e.g. coevaporation, sputtering technique), in other cases the metals or binaries are first deposited near room temperature and are then further annealed in a furnace in S/Se atmosphere in order to form $Cu_2ZnSn(S_ySe_{1-y})_4$. Amongst others, Weber et al. have applied multi stage evaporation techniques (Thin Solid Films, 517 (2009) 2524-2526). They have shown that a solar cell of 1.1% efficiency can be achieved by first depositing ZnS and subsequently S, Sn, and Cu.

In state of the art $(Ag_xCu_{1-x})_2ZnSn(S_ySe_{1-y})_4$ (x, y, z=0 . . . 1) absorber layer fabrication, a precursor film containing the metals or the metals together with selenium and/or sulfur is annealed, or heat-treated in an S/Se atmosphere according to the proposal by Katagiri et al., Solar Energy Materials and Solar Cells 49 (1997) 407-414.

However, despite such an annealing/heat treatment, tin losses have been observed and reported throughout the literature: e.g. Weber et al., JOURNAL OF APPLIED PHYSICS Vol. 107, pp. 013516 (2010) have proposed using inert gas in order to reduce the tin loss. Similar observations have been made in Weber et al., Thin Solid Films Vol. 517 (2009) pp. 2524-2526 Friedlmeier et al., 14th European Photovoltaic Solar Cell Conference Barcelona, Spain 1997 Redinger et al., APPLIED PHYSICS LETTERS, Vol. 97, pp. 092111 (2010); Scragg, PhD Thesis, University of Bath (England) (2010); Weber, PhD thesis, Helmholtz Zentrum Berlin (Germany) (2009).

Katagiri et al. in Solar Energy Materials and Solar Cells, 49, (1997), 407-414, have proposed addressing this problem by using an S/Se atmosphere during annealing; however, whilst this proposal achieves a reduction in tin loss, the loss cannot be completely avoided.

Annealing in furnaces is typically performed in an S/Se vapor together with different gases: Ar, $N_2$, $H_2$, $H_2/N_2$. Annealing in $N_2$ gas plus elemental sulfur vapor has been described by Araki et al., Thin Solid Films, 517 (2008) 1457-1460. Annealing in $N_2$ and 5 wt % $H_2S$ gas is disclosed in Katagiri et al., Solar Energy Materials and Solar Cells, 49 (1997) 407-414. Annealing in $N_2$ and 20 wt % $H_2S$ gas is described in Katagiri et al., Applied Physics Express, 1 (2008) 041201. Annealing in Ar and elemental S vapor and, alternatively, annealing in Ar and 5 wt % $H_2S$ gas has been suggested by Scragg et al., Thin Solid Films, 517 (2009) 2481-2484. Annealing in $N_2$+10 wt % $H_2$ and elemental S vapor has been disclosed in Scragg et al., Journal of Electroanalytical Chemistry, 646 (2010) 52-59. Finally, some annealing experiments have also been carried out under vacuum.

It is therefore an object of the present invention to overcome or alleviate at least some of the disadvantageous of the known methods of manufacturing $(Ag_xCu_{1-x})_2ZnSn(S_ySe_{1-y})_4$ semiconductor thin films.

SUMMARY OF THE INVENTION

So far, whilst the issue of tin loss has been proved and mentioned, however, apart from simply increasing the overall environmental pressure (for example by increasing the $N_2$ partial pressure, etc.) there have been no real proposals how to deal with it. Hence, the approach by the present invention aims to avoid tin loss by stabilizing the $(Ag_xCu_{1-x})_2ZnSn(S_ySe_{1-y})_4$ absorber layer during the process of annealing. Simultaneously, it also creates a new methodology to fabricate $(Ag_xCu_{1-x})_2ZnSn(S_ySe_{1-y})_4$ absorber layers.

In accordance with a first aspect of the present invention, there is provided a method of manufacturing $(Ag_xCu_{1-x})_2ZnSn(S_ySe_{1-y})_4$ thin films for solar cell applications. The method comprises providing a thin film comprising Ag and/or Cu, in which the thin film further comprises Zn. The thin film is annealed in an atmosphere comprising S and/or Se, and further comprising Sn, wherein the vapor pressure of Sn or Sn compounds in the atmosphere essentially in contact with the surface of the thin film is equal to or slightly higher than the partial pressure of Sn originating from the thin film.

Further advantageous ways of carrying out the present invention are as set out in the dependent claims.

The thin film provided prior to annealing may further comprise Sn.

The thin film provided prior to annealing may further comprise S and/or Se.

The step of annealing the thin film may comprise providing a Sn source in the form of elemental Sn or an Sn-containing composition, and heating the Sn source together with the thin film.

The Sn source may be an Sn containing composition further comprising S or Se.

The step of annealing the thin film in an atmosphere comprising Sn may further comprise providing a flow of gas comprising Sn and S/Se, and heating the gas together with the thin film.

The step of annealing may further comprise enclosing the thin film and the atmosphere in an inert enclosure.

At least one opening may be provided in the enclosure.

The thin film may be provided on a substrate.

The substrate may be molybdenum.

The thin film provided may comprise at least one layer comprising Zn.

The thin film provided may comprise at least one layer comprising Ag and/or Cu.

The thin film provided may comprise at least one layer comprising S and/or Se.

The thin film provided may comprise at least one layer comprising Sn.

Advantages

The main advantages of a method of manufacturing $(Ag_xCu_{1-x})_2ZnSn(S_ySe_{1-y})_4$ semiconductor thin films in accordance with the present invention are the following:

The method allows the production of $(Ag_xCu_{1-x})_2ZnSn(S_ySe_{1-y})_4$ absorber films and may avoid the loss of tin. It may enable a precise control of the tin content in the thin films and may thus enable a well-controlled production of these absorber films. Based on the method in accordance with the present invention it may be possible to establish a well-controlled $(Ag_xCu_{1-x})_2ZnSn(S_ySe_{1-y})_4$ production process, which has not been possible using the state of the art technology.

Further advantages arise from the fact that the final product is in principle not much different than that of $(Ag_xCu_{1-x})_2ZnSn(S_ySe_{1-y})_4$ absorbers prepared by conventional production methods. However, the present invention may allow to control much better the production process. Furthermore, the present invention may allow improving the quality of the thin film surface, because Sn loss may be avoided.

The new annealing process in accordance with the present invention is no more complicated than the conventionally used annealing processes and therefore no obstacles are expected in its industrial implementation.

BRIEF DESCRIPTION OF THE DRAWINGS

These and other aspects of the invention will now be further described, by way of example only, with reference to the accompanying figures.

FIGS. 1a) to 1c) are an illustration of the steps of the method according to the present invention.

FIGS. 3a) and 3b) are illustrations of a further advantageous step of carrying out the present invention.

FIGS. 4a) to 4d) are illustrations of advantageous thin films for use with the method according to the present invention.

DETAILED DESCRIPTION OF THE INVENTION

Figure 1:
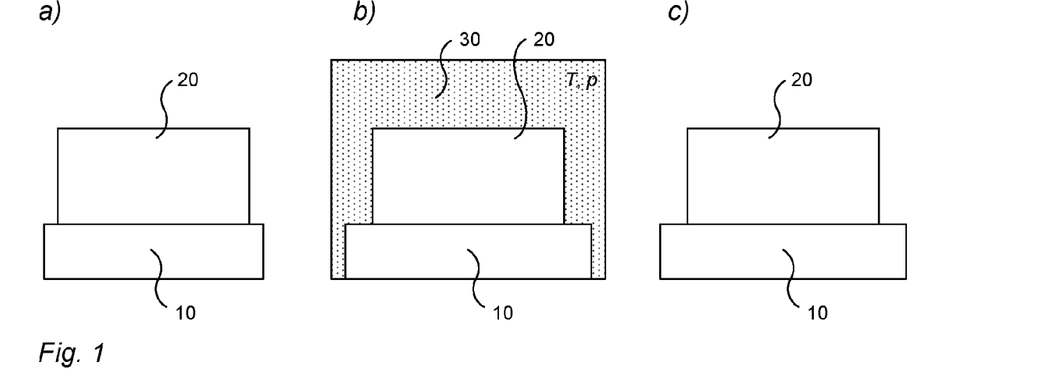

In accordance with the present invention, a method is provided for manufacturing and stabilizing $(Ag_xCu_{1-x})_2ZnSn(S_ySe_{1-y})_4$ thin films for solar cell applications. As shown in FIG. 1a, a thin film 20 is provided comprising Ag and/or Cu. The thin film 20 further comprises Zn. As shown in FIG. 1b, the thin film 20 is annealed at an elevated temperature T and a pressure p in an atmosphere 30 comprising S and/or Se, and further comprising Sn. The vapor pressure of Sn or Sn compounds in the atmosphere 30 essentially in contact with the surface of the thin film 20 is adjusted so that it is equal to or higher than the partial pressure of Sn or Sn compounds originating from the thin film 20. This method produces a $(Ag_xCu_{1-x})_2ZnSn(S_ySe_{1-y})_4$ thin film 20, as shown in FIG. 1c.

The present invention is based on the realization that providing an atmosphere comprising Sn, preferably S/Se+Sn$_h$(S/Se)$_k$ (with h, k=0 ... 1), at high vapor pressure during the annealing of thin films allows to form an equilibrium between desorption and incorporation of Sn leading to the production of $(Ag_xCu_{1-x})_2ZnSn(S_ySe_{1-y})_4$ that does not exhibit tin loss.

Therefore the present invention is suitable not only to heat treat, respectively anneal such thin films in a S/Se atmosphere, but applies by analogy in a S/Se+Sn or a S/Se+Sn$_h$(S/Se)$_k$ environment. The present invention is thus suitable for application in (i) the incorporation of tin into a precursor thin film which does not have the requisite amount of tin and (ii) the stabilization of a complete $(Ag_xCu_{1-x})_2ZnSn(S_ySe_{1-y})_4$ thin film absorber layer during an annealing process.

According to a first aspect of the present invention, with reference to FIGS. 1a to 1c, a tin-free or tin-deficient precursor thin film 20 of any combination of the residual metals and the chalcogen, prepared by any method, is annealed/heat treated in a S/Se+Sn$_h$(S/Se)$_k$ atmosphere 30 to form and stabilize the desired thin film $(Ag_xCu_{1-x})_2ZnSn(S_ySe_{1-y})_4$ absorber layer, by supplying S/Se and Sn to the precursor thin film 20.

Figure 2:
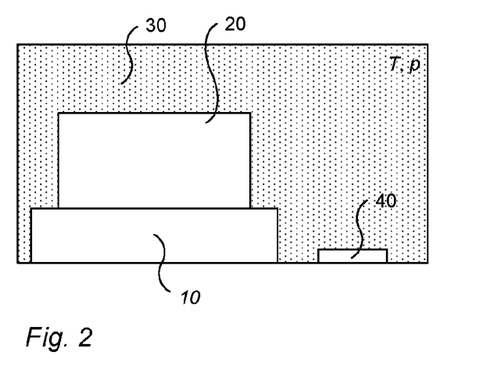
FIG. 2 is an illustration of advantageous step of carrying out the present invention.

Such a S/Se+Sn(S/Se), environment can be created by various possible methods. With reference to FIG. 2, the step of annealing the thin film 20 in an atmosphere 30 comprising Sn advantageously comprises providing a Sn source 40 in the form of elemental Sn or an Sn-containing composition and heating the Sn source 40 together with the thin film 20. It may further be preferred that the Sn source 40 is an Sn containing composition which further comprises S or Se.

As shown in FIG. 3a) the annealing may take place in a tube furnace, advantageously inside an inert enclosure 60, preferably a graphite box. It may further be preferred to provide at least one opening 61 in the enclosure 60, as illustrated in FIG. 3b).

Figure 4:
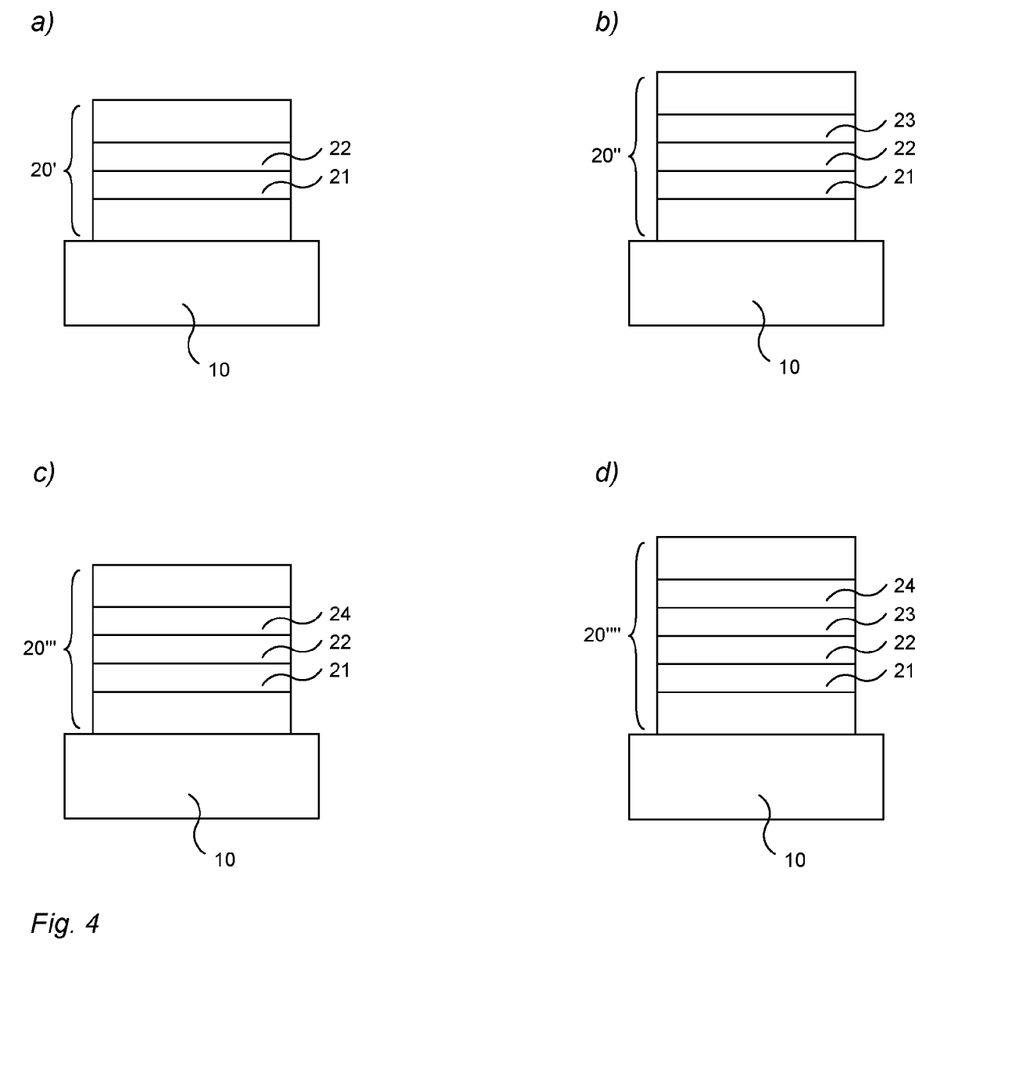

With reference to FIG. 4a), it may be preferred to provide a precursor thin film 20' in which at least one layer 21 comprises Zn and in which at least one layer 22 comprises Ag and/or Cu. As illustrated in FIG. 4b), it may be preferred to provide a precursor thin film 20" in which at least one layer 23 comprises S and/or Se. Also, it may be preferred to provide a precursor thin film 20''' in which at least one layer 24 comprises Sn, as shown in FIG. 4c).

In some cases, it may be advantages to use a thin film 20'''' comprising at least one layer 21 comprising Zn, at least one layer 22 comprising Ag and/or Cu, at least one layer 23 comprising S and/or Se, and at least one layer 24 comprising Sn, as shown in FIG. 4d). The skilled person will understand that the layers 21, 22, 23, 24 may be combined as required, and any one or more of these layers may be repeated in the thin film 20 with or without intermediate layers.

The incorporation of tin into the precursor thin film to form the desired $(Ag_xCu_{1-x})_2ZnSn(S_ySe_{1-y})_4$ absorber layer is achieved by the in-diffusion of Sn$_h$(S/Se)$_k$ into the sample until an equilibrium of the in- and out-diffusion of Sn$_h$(S/Se)$_k$ into/out of the sample is reached. Furthermore, the formed equilibrium of Sn$_h$(S/Se)$_k$ in- and out-diffusion prevents the sample from degradation due to tin loss.

This last effect leads to a second aspect of the invention: The stabilization of a $(Ag_xCu_{1-x})_2ZnSn(S_ySe_{1-y})_4$ absorber layer during an annealing/heat treatment step. Hereby, the annealing/heat treatment of a precursor thin film 20 containing all metals and/or chalcogen, or of an as-grown $(Ag_xCu_{1-x})_2ZnSn(S_ySe_{1-y})_4$ thin film in a S/Se+Sn$_h$(S/Se)$_k$ environment 30 leads to a similar equilibrium of an in- and out-diffusion of $Sn_h(S/Se)_k$ into/out of the sample. As discussed before, such equilibrium prevents the sample from degradation due to tin loss. The required $S/Se+Sn_h(S/Se)_k$ atmosphere 30 can be obtained by various possible methods, for example and amongst others by elemental S/Se (or $H_2S/Se$ gas, or others) together with $Sn_h(S/Se)_k$ powder, by introducing elemental Sn together with elemental S/Se to form $Sn_h(S/Se)_k+S/Se$, or to provide more than the desired amount of Sn and S/Se inside the sample which is then partly released into the environment in the form of, for example, $Sn_h(S/Se)_k$ until an equilibrium of $Sn_h(S/Se)_k$ loss and $Sn_h(S/Se)_k$ incorporation into the sample would be achieved. Further methods to provide the necessary $S/Se+Sn_h(S/Se)_k$ environment could be thought of which however do not change the fundamental concept of this invention.

The method in accordance with the present invention thus provides a promising mechanism for the necessary annealing/heat treatment step which solves the known problem of tin loss and it further provides a new method of incorporating tin into a previously tin-free precursor material.

The method according to the present invention has been successfully tested for both, the tin incorporation into a tin-free precursor by annealing in a $S/Se+Sn_h(S/Se)_k$ atmosphere, as well as the stabilization of a $Cu_2ZnSn(S_ySe_{1-y})_4$ as grown thin film during its annealing step.

Figure 3:
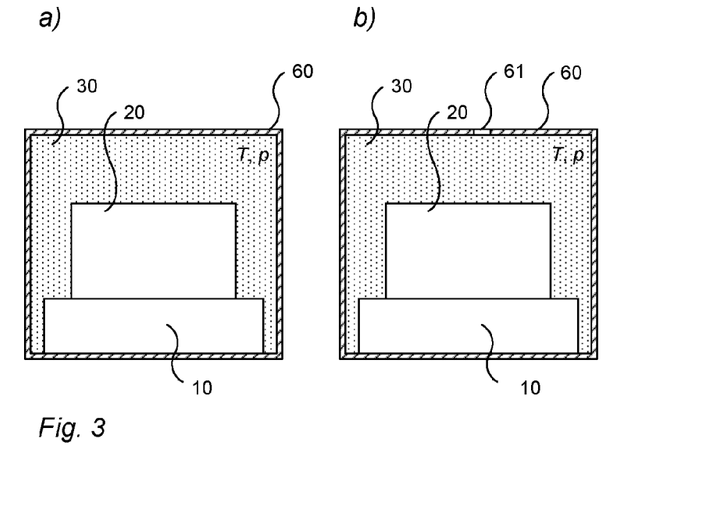

As illustrated in FIG. 4a), a precursor thin film 20' consisting of a stack of a Zn layer 21 and a Cu layer 22 on Mo as the substrate 10 has been prepared, using the technique of electro-deposition. This precursor was then cut into four equal pieces from which three were annealed in only a S environment, after which two of those three were annealed in a $S+SnS_z$ environment. The annealing in a tube furnace took place inside a graphite box, as shown in FIG. 3, into which the sample was put together with elemental S and powdery $SnS_2$. The conditions in both cases were as follows:
- 60 min at T=100° C. under vacuum ($p=10^{-3}$ mbar)
- 120 min at T=560° C. at p=500 mbar of 90% $N_2$+10% $H_2$
- Volume of box: 24.3 cm³ (box had a hole of 2 mm diameter in the lid)
- mass of elemental sulfur $m_s \approx 100$ mg (given in excess)
- mass of powdery $SnS_2$ $m_{SnS2} \approx 10$ mg (given in excess in the case of the $S+SnS_z$ annealing)

The outcome of this annealing, as tested by an EDX measurement, was that the quarter that was only annealed in S showed no indication of Sn but only of S inside the thin film whereas one of the two that were additionally annealed in a $S+SnS_z$ environment did show substantially the desired amount of Sn (and S) in the film as was needed to form the desired composition of $Cu_2ZnSnS_4$. The experiment of annealing in a Sn environment were successfully repeated with Se and $Se+SnSe_z$, using the same conditions but annealing with elemental Se and some small $SnSe_2$ crystallites.

To confirm that in the two cases the desired $Cu_2ZnSn(S/Se)_4$ compounds had been formed, firstly X-Ray Diffraction (XRD) analysis had been performed and proved the desired crystal structure, secondly Energy-Dispersive X-ray spectroscopy (EDX) did confirm the stoichiometric composition of the thin film, and finally Scanning Electron Microscopy (SEM) did show homogeneous layers. In addition to those analyses, photo-electrochemical measurements have been performed and p-type semiconductivity as well as photo-conducting properties could be confirmed with respect to literature data. Last but not least the band gap of $Cu_2ZnSnS_4$ could be measured to be around 1.4 to 1.5 eV by absorption measurements, which is in good agreement with literature values, and first attempts to make solar cells showed low efficiencies of 0.34% (despite a non-stoichiometric composition of this particular sample).

To prove the point of stabilization of a $Cu_2ZnSn(S_ySe_{1-y})_4$ as grown thin film during its annealing step, three $Cu_2ZnSnSe_4$ thin films have been grown in parallel by Physical Vapor Deposition (PVD) under the following conditions:
- Single step coevaporation of Cu, Zn, Sn, and Se at 330° C. sample temperature.
- Composition deduced by EDX: Cu/(Sn+Zn)=0.88; Zn/Sn=1.08

Sample 1 has been used to produce a solar cell. This as grown sample shows an efficiency of 0.14%.

Sample 2 has been annealed in a $S+(H_2/N_2)$ environment. Compared to the as grown sample, EDX analysis reveals Sn losses. The surface morphology does not look single phase and it is obvious that a strong degradation of the surface region took place. Consequently, the finished solar cells show only very low performances (of around 0.02%)

Sample 3 has been annealed in an S atmosphere together with elemental Sn and $(H_2/N_2)$. Throughout the annealing, Sn+S formed $SnS_z$ and the equilibrium of in- and out-diffusion of $SnS_z$ prevents the sample from Sn loss. The EDX ratios measured before and after annealing were identical within the error, which shows that the same level of Sn in the film was maintained. The surface morphology looks single phase, in contrast to sample 2. Solar cells performed from this absorber show a maximum efficiency of 5.4%. This is an enormous improvement compared to sample 1 and 2.

We have shown that annealing in the additional presence of Sn or $Sn_h(S/Se)_k$ not only prevents the loss of tin and hence stabilizes the composition in a self-regulating way, but can also be used as a new methodology to incorporate tin into a precursor. Both effects are highly desired and will considerably improve the preparation of kesterite-based semiconductor films for solar cell and other applications.

A presently preferred material for the substrate 10 is molybdenum (Mo), but other suitable substrates may be used, too.

Experimental Data

As discussed above, copper-zinc-tin-chalcogenide kesterites, $Cu_2ZnSnS_4$ and $Cu_2ZnSnSe_4$ (CZTS(e)) are ideal candidates for the production of thin film solar cells on large scales due to the high natural abundance of all constituents, a tunable direct bandgap ranging from 1.0-1.5 eV, a large absorption coefficient, and demonstrated power conversion efficiencies close to 10% [1]. However, Sn losses through desorption of SnS(e) from CZTS(e) at elevated temperatures (about 400° C.) [2-5] impede the thorough control of film composition and film homogeneity. No robust and feasible fabrication process is currently available. Here we show that understanding the formation reaction of the kesterite absorber is the key to control the growth process and to drastically improve the solar cell efficiency. Furthermore, we demonstrate that this knowledge can be used to simplify the four dimensional parameter space (spanned by the four different elements) to an easy and robust two dimensional process. Sufficiently high partial pressures of SnS(e) and S(e) (a) prevents the decomposition reaction of the CZTS(e) at elevated temperatures and (b) introduces any missing Sn into a Sn deficient film. This finding enables us to simplify the precursor film, used for absorber fabrication to a Cu/Zn containing layer and Sn and S(e) are introduced from the gas phase by a self-regulating process.

The major challenge for cost-effective solar electricity is to provide technologies, which enable in a convenient, manufacturable form, the low-cost capture and conversion of sunlight [6]. Because of their extremely low raw material cost, kesterites can play a major role in such technologies, if it will be possible to define a robust and feasible production process. A variety of different procedures have been introduced in the last decade to prepare CZTS(e) thin films. The most successful in terms of solar cell efficiency is a liquid based process where all constituents are solved in a hydrazine solution which is spin coated onto a molybdenum coated glass substrate followed by a short annealing to 540° C. on a hotplate [1]. A record efficiency of 9.7% has been achieved with this technique whereas vacuum based processes show efficiencies lower than 7% [7-9]. The major issue for vacuum processes is the loss of Sn at temperatures above 400° C. [2-5], which occurs via a decomposition reaction of the CZTS(e) [4]. The best performing devices have been produced by rapid coevaporation [8] (4.1% CZTS solar cell), by low temperature coevaporation followed by the annealing [7] (6.8% CZTS) or by annealing precursors in a $H_2S$ atmosphere [9] (6.7% CZTS). These methods have been developed empirically. Throughout the literature no consensus exists describing the prerequisites to form CZTS(e) thin films suitable for solar cells. It is not clear why some annealing routines are beneficial and which steps are detrimental. We will show here, that the key physical mechanism limiting solar cell performance is the loss of Sn independent of the preparation routine and that the way to improve the solar cell performance is to avoid Sn loss by the use of the chemical equilibrium of the decomposition reaction.

Figure 5:
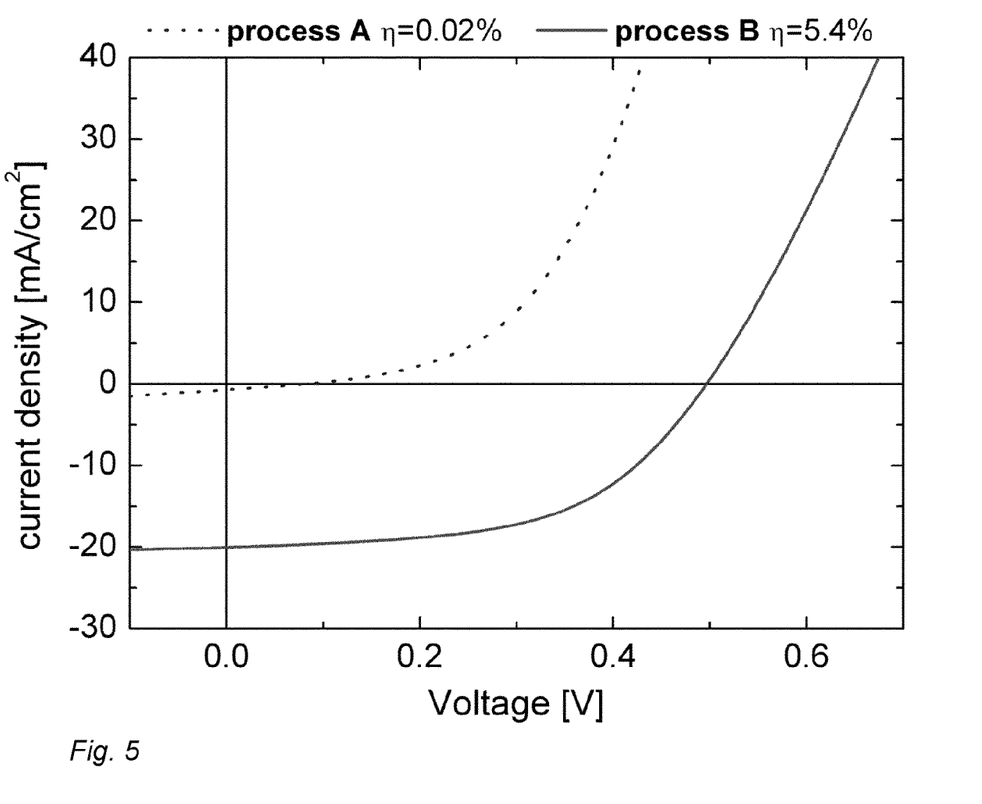
FIG. 5 shows Current-Voltage characteristics of two CZT(S,Se) solar cell under illumination.

FIG. 5 shows Current-Voltage characteristics of two CZT (S,Se) solar cell under illumination. Process A: annealing in sulfur only, process B: annealing in sulfur and SnS(g).

FIG. 5 shows the solar cell performance of two samples produced by two different annealing procedures. Both precursors were formed by coevaporation of Cu, Zn, Sn and Se on Mo coated glass substrates at a substrate temperature of 330° C. The composition of both precursors, as deduced from energy dispersive X-Ray analysis, has been found to be Cu/(Sn+Zn)=0.9 and Zn/Sn=1.1. These values are close to those observed in the highest efficiency solar cells [1, 7, and 9]. The chosen process temperature is low enough to prevent loss of Sn and therefore enables the thorough control of the film composition [5]. Additional annealing step is mandatory to improve the crystallinity of the thin film. The heat treatment has been performed in a small graphite box in an excess sulfur atmosphere at a temperature of 560° C. for 120 min. This leads to an incomplete substitution of Se by S, a phenomenon well known from the related $Cu(In,Ga)(Se,S)_2$ compounds (see e.g. [10]). Mixed CZT(S/Se) thin films are currently the best performing devices [1]. In a first experiment (denoted process A) the film has been annealed in 1 mbar forming gas and excess elemental sulfur which is provided in the form of pellets. The current-voltage characteristics as shown in FIG. 5 illustrates that the performance of the device is unacceptable. An efficiency of 0.02% and an extremely small short circuit current $J_{SC}$=0.72 mA/cm$^2$ and an open circuit voltage $V_{OC}$=80 mV have been observed. In a second experiment (process B) the annealing procedure has been repeated except that an additional 1 mg Sn was present in the box. FIG. 5 shows the current-voltage characteristics of the resulting solar cell with a short circuit current $J_{SC}$=20 mA/cm$^2$, an open circuit voltage $V_{OC}$=497 mV and an efficiency of 5.4%, more than two orders of magnitude better than case A. The cell exhibits a bandgap of approximately 1.2 eV, as indicated by quantum efficiency measurements (see supplementary FIG. 6). During the sulfurization of the CZTSe, roughly 50% of the Se has been substituted by S, as deduced from EDX analysis. The performance of the solar cell is limited by a series resistance of 3 Ωcm$^2$ in accordance with other reported CZT(S,Se) solar cells [7] (see supplementary Table I for solar cell parameters). The reproducibility of the process has been tested successfully but no further optimization in terms of composition and annealing procedure has been performed so far. We have prepared solar cells better than the one of process (A) in the past, even by annealing without additional Sn, this indicates that the result of process (B) can be further optimized. However, process (A) and (B) allow the direct comparison of a process with and without additional Sn. The result clearly shows the beneficial effect of a Sn source during the absorber formation.

It is known that annealing a CZTS film in vacuum to 500° C. or higher leads to decomposition. Weber et al. showed by in situ X-Ray diffraction and fluorescence measurements that CZTS decomposes into solid $Cu_2S$ and ZnS [4]. They imply that volatile SnS and S were lost from the sample. According to this reaction the loss of Sn proceeds via desorption of SnS(e). SnS and SnSe are materials with a significant vapor pressure above 400° C. [11 and 12]. The proposed decomposition reaction occurs in vacuum, the volatile species condense on the cold walls, i.e. the process is far from equilibrium. However, if conditions are such that an equilibrium can be reached, the decomposition reaction stops as soon as the partial pressure of the volatile products reaches the saturation pressure $p_V$. The solid compound is then in a dynamic equilibrium with its vapor. Consequently, upon annealing SnS(e) and S evaporate only as long as their partial pressure is smaller than $p_V$. Equation 1 illustrates the proposed stoichiometric chemical equilibrium reaction, based on the decomposition reaction proposed by Weber [4], however now indicating that given high enough pressure of the products the reaction will proceed towards CZTS(e) (illustrated with: ↔).

$$Cu_2ZnSnS_4(s) \leftrightarrow Cu_2S(s)+ZnS(s)+SnS(g)+\tfrac{1}{2}S_2(g) \quad (1)$$

This explains that in experiment (A) the loss of SnS(e) is not compensated by any significant SnS(e) partial pressure which leads to a loss of Sn from the surface region, even though the Sn loss is marginal in the integral composition of the film. Clearly, the electronic structure of a Sn depleted surface is not favorable for the formation of the p/n junction, as indicated by the poor efficiency obtained by process (A). In experiment (B) the additional Sn is quickly transformed in the presence of S into SnS(g) which supplies the necessary $p_S$ right from the beginning of the annealing process. As a result the decomposition of the CZTS(e) is inhibited.

Based on equation (1) it could be assumed that an excess S(e) atmosphere would also stop the decomposition reaction. However, the necessary partial pressure of S(e) is very high, as can be inferred from the decomposition of $SnS_2 \rightarrow SnS(s)+\tfrac{1}{2}S_2(g)$, which has a saturation partial pressure of $S_2$ of about $10^{-1}$ mbar at 550° C. compared to about $10^{-3}$ mbar in the case of SnS(s)→SnS(g) [11]. Furthermore, the elemental S(e) in the annealing box will mostly form S(e)$_5$ rings, which are not suitable to balance the pressure of reactive S(e)$_2$. Therefore, the only way to reach equilibrium is to supply SnS(e) or reactive S(e)$_2$ in order to quickly reach $p_V$, which will prevent the decomposition reaction shown in equation (1).

From the presented solar cell results we conclude that the control of Sn losses is a prerequisite to form decent solar cells. In this case it is accomplished by introducing elemental Sn in the presence of S(e) into the annealing volume. They form a partial pressure of the volatile SnS(e) and prevent the decomposition. The equilibrium in equation 1 is then shifted towards the reactant side, i.e. towards CZTS(e). The control of this equilibrium is the key to high quality CZTS(e) films.

To investigate the equilibrium we have performed a series of annealing experiments, starting from a stack of only Cu and Zn which has been electrodeposited on Mo coated glass. The thicknesses in the metal stack are chosen to match the final CZTS composition.

The three annealing experiments described in the following are produced in series from a single sample. A first annealing denoted as (I) is performed in a sulfur atmosphere at a temperature of 560° C. for 120 min to form $Cu_xS+ZnS$. Consequently anneal (I) yields a sample equivalent to the right hand side of equation 1 except for the absent gas phase species, SnS and ½ $S_2$. The second heat treatment denoted as (II) is performed in a sulfur and SnS atmosphere at a temperature of 560° C. for 120 min to form CZTS and to drive the reaction to the left hand side of equation (1). The supply of SnS(g) is realized by introducing $SnS_2$ powder into the box. The solid $SnS_2$ is known to quickly decompose into $SnS(g)+½S_2(g)$ [11]. In the third experiment (labeled (III)) the CZTS thin film is annealed in vacuum, i.e. in very low SnS partial pressure, at a temperature of 560° C. for six hours. According to equation (1) the thin film should decompose into $Cu_xS$ and ZnS. The samples have been investigated by grazing incidence X-ray diffraction (XRD), energy and wavelength dispersive X-ray mappings (EDX/WDX).

Figure 6:
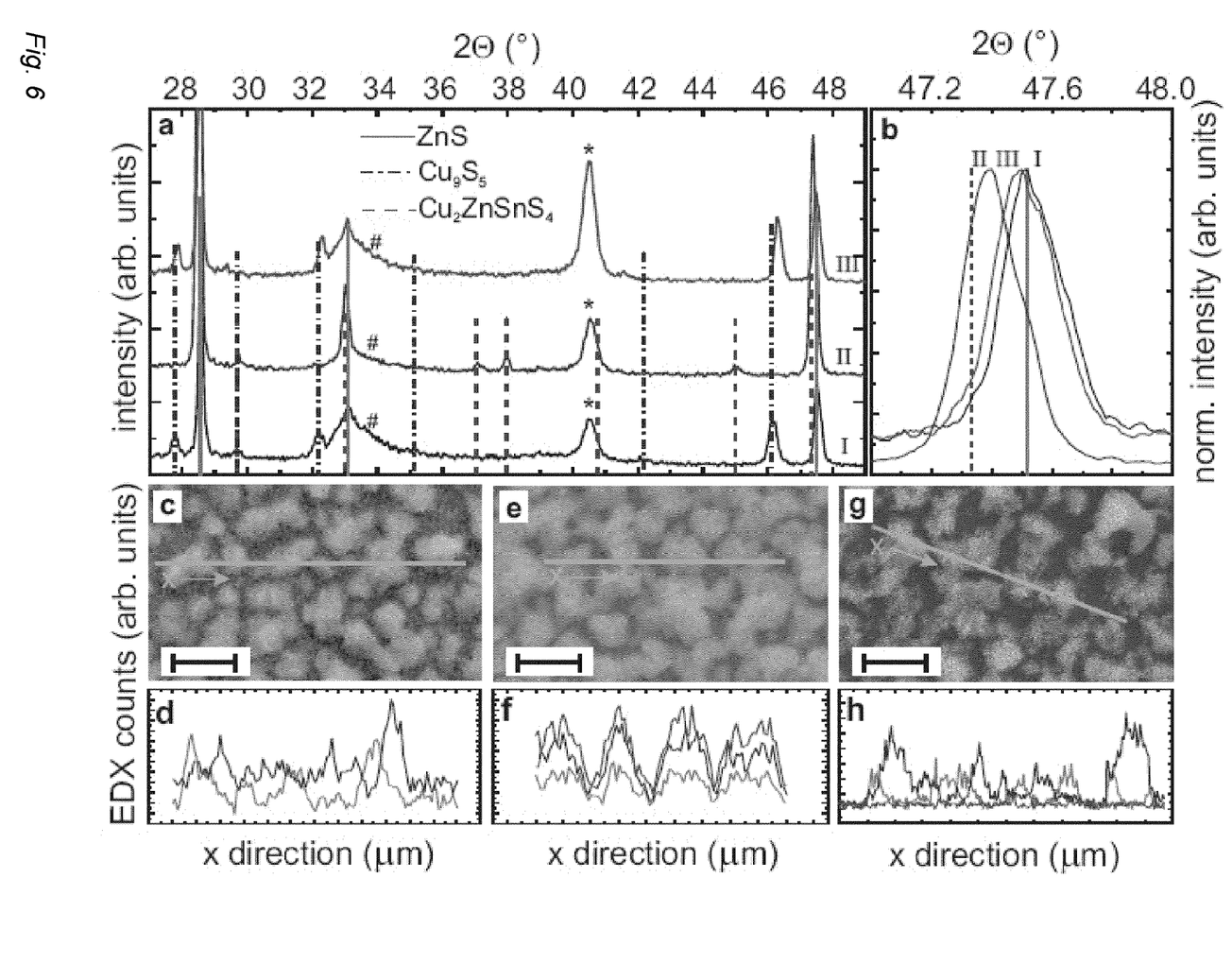
FIG. 6 shows grazing incidence x-ray diffraction scans as well as energy dispersive x-ray mapping and line scan results of three different annealing experiments.

FIG. 6 is a grazing incidence x-ray diffraction scans of three different annealing experiments which elucidate the equilibrium proposed in equation (1). Scan (I): after annealing of a Cu/Zn stack in S(g). Scan (II): after annealing of a mixed $Cu_9S_5$ and ZnS film in S(g) and SnS(g). Scan (III): after annealing CZTS in vacuum. Identified phases: —ZnS, —.—$Cu_9S_5$, — —$Cu_2ZnSnS_4$, * Mo substrate, # $MoS_2$ (JCPDS Pattern indicated in Methods section). b enlarged view on (220) CZTS reflex. (c)(e)(g) EDX topview mappings: red_Cu, green_Zn, blue_Sn, details see text. (c) corresponds to process (I), e corresponds to process II, g corresponds to process III. d linescan indicated in c, f linescan indicated in e, h linescan indicated in g. Bars in SEM images equal to 3 µm.

FIGS. 6(a) and (b) depicts the XRD analysis of different heating steps while EDX mapping results are shown in FIG. 6(c)-(h). In the first annealing (I) reflections originating from ZnS and $Cu_9S_5$, i.e. a slightly Cu poor $Cu_2S$, are identified. Moreover, the Mo substrate (denoted by *) and a small contribution of $MoS_2$ (labeled by #) are found. WDX analysis yields a Cu/Zn composition of 1.6. EDX mapping of the surface shown in FIG. 6(c) enables us to analyze the lateral distribution of the $Cu_xS$ and ZnS grains. The intensity of X-rays with an energy equal to the Cu K line is color-coded in red whereas the Zn K line is colored in green. No intermixing of the Cu and Zn signal occurs since only red and green is visible after addition of the two EDX images. This is confirmed in FIG. 6(d) where an EDX linescan is shown. It is clearly visible that the Cu and Zn signal are anti-correlated which means that $Cu_2S$ and ZnS do not intermix.

In the XRD analysis of annealing (II), where SnS was present, no indication of a $Cu_xS$ is visible anymore as shown in FIG. 6(a). Moreover additional reflections corroborate that CZTS has been formed (see 2θ=29.7°, 37°, 38°, 45°). Since the main reflexes of ZnS and CZTS are very close (2θ=28.5° and 47.3°), we cannot exclude remaining ZnS that has not been transformed into CZTS. However the small shift towards lower angles shown in FIG. 6(b) confirms that the majority of the ZnS has been consumed. This is also apparent in FIGS. 6(e) and (f) where the EDX signals of Cu, Zn, Sn show a strong correlation in complete contrast to FIG. 6(c) where Cu and Zn showed a strong anti-correlation. Even more interesting is that the resulting WDX concentrations ratios, Cu/(Zn+Sn)=0.78 and Zn/Sn=0.97, are very close to the optimum values for high performance solar cell absorbers. This shows that the incorporation of Sn via SnS does not proceed in a random way but is self-limiting.

As long as enough $Cu_xS$ and ZnS are present, SnS and S from the gas phase are incorporated in the film to form CZTS. This model experiment shows that equation (1) can be used to form CZTS by controlling the partial pressure of the volatile species. In the presented case the presence of a Sn source drives the reaction towards the CZTS side. Of course the situation can be reversed by taking the finished CZTS absorber and repeating the annealing step for a third time without S or $SnS_2$ in the box. The heating (III) has been performed under vacuum to reduce the S and SnS partial pressures to a minimum. After six hours of heating the CZTS has been transformed back into $Cu_xS$ and ZnS as shown by the XRD analysis (FIG. 6(a)). A Sn concentration of only 0.2 at % is identified by WDX analysis and the mapping depicted in FIG. 6(g)(h) is again anti-correlated.

Based on the equilibrium in equation (1) we predict that to avoid Sn loss and achieve high quality absorbers and surfaces (i) excess SnS(e) has to present during the annealing step of any precursor annealing process of kesterite absorbers, (ii) a coevaporation process requires high partial pressure of about $10^{-3}$ mbar of SnS(e), (iii) reactive $S(e)_2$ species from a cracker source will not provide a high enough partial pressure to avoid Sn loss. These predictions are in part confirmed by those processes that have achieved reasonable efficiency kesterite solar cells so far: a very fast coevaporation process [8] or a very short annealing process [1 and 7] minimize the time available for the decomposition reaction and thus reduce Sn loss. Annealing in $H_2S$ [9] can provide a sufficiently high partial pressure of S radicals via the decomposition of $H_2S$ driving reaction (1) towards CZTS.

Figure 7:
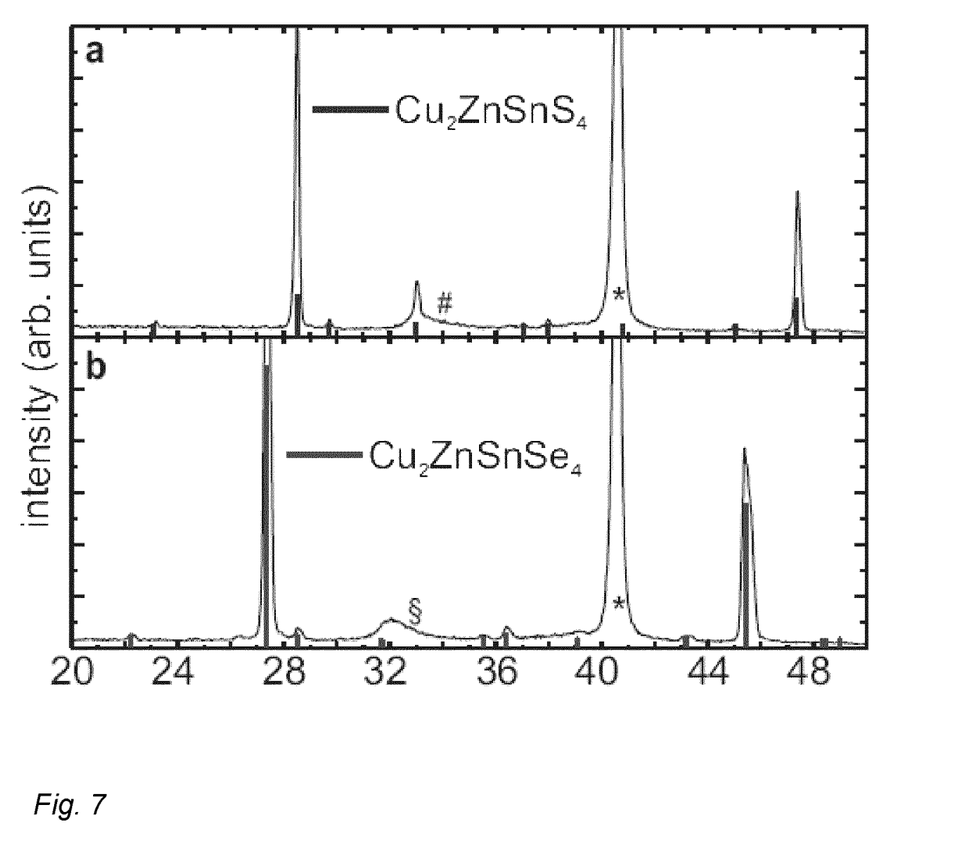
FIG. 7 shows x-ray diffraction analysis of a) CZTS and b) CZTSe thin films, were a Cu/Zn stack was annealed together with a) S+SnS$_2$ and b) Se+SnSe$_2$ powder, respectively.

FIG. 7 shows X Ray diffraction analysis of a) CZTS and b) CZTSe. a) Cu/Zn stack annealed in with S and $SnS_2$ pellets. Most peaks can be identified with the $Cu_2ZnSnS_4$ kesterite phase (—). Moreover Mo (denoted as *) and a small contribution of $MoS_2$ (denoted as #) is identified. b) Cu/Zn stack annealed with S and $SnS_2$ pellets. Reflections can be assigned to CZTSe (—), Mo and $MoSe_2$ (denoted as §). For JCPDS data see Methods section.

A further prediction is that the self-regulating nature of the Sn incorporation can be used to drastically simplify the preparation process. FIG. 7 shows the result of a process where a Cu/Zn stack is annealed directly in (a) S and $SnS_2$ and in (b) Se and $SnSe_2$. The XRD analysis corroborates that in both cases the quaternary semiconductor has been formed. All reflections can be identified with CZT(S,Se) except Mo and $MoS_2$ which originate from the substrate. EDX results show that again the incorporation proceeds in a self limiting way and no secondary phase can be detected by XRD. The small difference in the lattice constant of the CZTSe compared to the literature values is due to a small amount of S which was still present in the annealing furnace and was consequently incorporated into the film.

In conclusion we showed that understanding the growth reaction for the formation of CZTS(e) is the key to dramatically improve the solar cell efficiency. The Sn losses have to be controlled in order to from a high quality p-type surface. Incorporating excess Sn+S to the annealing environment improves the solar cell efficiency significantly and reproducibly by more than two orders of magnitude. Moreover, the presented findings offer a unique possibility to produce CZT(S,Se) thin film absorbers on the basis of a very simple precursor, namely a Cu/Zn stack and one annealing step. The final composition of the CZTS can be governed simply by controlling the Cu/Zn ratio in the precursor since Sn and S are included in a self-controlled way. The described equilibrium reaction is valid for CZTS, CZTSe and mixed CZTS(e) thin films. The four-dimensional parameter space spanned by four elements is reduced to two dimensions.

Methods

Physical Vapor Deposition

CZTSe thin films have been prepared by physical vapor deposition in a molecular beam epitaxy system with a base pressure of $1 \cdot 10^{-8}$ mbar without bake-out. Effusion cells are used to evaporate Zn, Sn, Cu, and Se on commercially available Mo coated soda lime glass. Sample temperature is measured with a pyrometer and the deposition rates are controlled with a quartz crystal monitor, an electron beam emission spectroscopy system and a beam flux monitor.

Electrodeposition

Low cost CZTS and CZTSe thin films are produced by a sequential electro-deposition of a Cu/Zn stack, carried out potentiostatically in three-electrode mode onto Mo coated soda lime glass substrates, followed by an annealing step which incorporates Sn and S. For the electrodeposition, the substrates were mounted in the face of a cylindrical polypropylene block placed face-down in the electrodeposition solution and rotated during deposition. A platinum foil counter and a Ag|AgCl, and Hg|HgO reference electrodes were used for the deposition of Zn from an acidic $ZnCl_2$ solution, and for the deposition of Cu from a basic $CuSO_4$ solution, respectively. Between depositions, the layers were thoroughly rinsed with de-ionized water and dried with nitrogen. The aqueous solution for the Cu deposition contains 3M NaOH, 0.2M Sorbitol, 0.1M $CuSO_4$. $7H_2O$, and 0.93 mM Empigen, the deposition potential is $-1.20V$. The aqueous solution for the Zn deposition contains 3M KCl, 50 mM $ZnCl_2$, 1 wt. % pH3 hydrion buffer, and 0.2 wt. % Poly[bis(2-chloroethyl) ether-alt-1,3-bis[3-(dimethylamino)propyl]-urea], the deposition potential is $-1.24V$. All deposition potentials mentioned are given vs. a saturated Calomel electrode.

Annealing Furnace

Annealing of the Cu/Zn precursor and the as grown CZTSe samples has been carried out in a tube furnace with vacuum/gas capabilities. The substrates are placed together with S(e) in excess and $SnS(e)_2$ in excess, Sn in excess inside a graphite container which is moved into the tube furnace, respectively. The volume of the box equals to 24.3 $cm^3$ and a small hole (diameter=2 mm) enables the filling of the background gas prior to annealing. The Cu/Zn precursors have been annealed for 2 hours at 560° C. in a 90% $N_2$+10% $H_2$ forming gas atmosphere of 500 mbar, the as grown CZTSe samples were annealed under about 1 mbar forming gas.

Device Fabrication.

Prior to solar cell fabrication the films were etched in aqueous KCN (5 wt %) to remove any copper sulfide/selenide phases from the surface. Devices were formed by chemical bath deposited of CdS, followed by sputtered i-ZnO and Al:ZnO layers and a Ni/Al contact grid.

JV Characterization

Solar cell characterization has been performed with a home current-voltage setup. An illumination power of 1000 $W/m^2$ originating from a Halogen (ELH120V) lamp is used. The sample holder is regulated to 25° C. via a Pelletier element situated underneath the sample.

X-Ray Diffraction

X-Ray diffraction has been carried out at room temperature in a grazing incidence mode with an incoming angle of e=0.75° of x-rays from a Cu source ($K\alpha_{1+2}$ lines). The scan range has been set to 20° to 80° with an integration time of 3 s and a step size of 0.01°. Phase identification is based on the JCPDS data base 2008. The used diffractograms throughout the manuscript are: Mo (PDF: 04-001-0059), $MoS_2$ (PDF: 04-004-4330), $MoSe_2$ (PDF: 04-003-6623), ZnS (PDF: 00-005-0566), $Cu_9S_5$ (PDF: 00-023-0962), $Cu_2ZnSnS_4$ (PDF: 00-026-0575), and $Cu_2ZnSnSe_4$ (PDF: 04-010-6295). In the latter case, the unit cell parameters of the PDF from the database were changed towards smaller values (a=5.654 Å, c=11.274 Å) to fit to the measured spectra, since the $Cu_2ZnSnSe_4$ sample also contained about 10 at. % of S.

Energy and Wavelength Dispersive X-Ray Analysis

The composition analysis has been performed with an energy and wavelength dispersive X-Ray analysis system (EDX/WDX) attached to a cold field emission scanning electron microscope. The global composition is measured with 20 keV electron energy and three different spots on the surface are averaged in order to gain a representative measure. EDX mapping is performed by scanning over an area of about 600 $\mu m^2$ and an energy of 20 keV is used. The elements are identified as follows. Each element is identified via integration over a small energy range of the emitted X-Ray spectrum. Example Cu, line: Ka1, energy: 8.05 keV, integration: 7.95 to 8.15 keV; Zn, line: Ka1, energy: 8.63 keV, integration: 8.55 to 8.74 keV; Sn, line: La1, energy: 3.45 keV, integration: 3.38 to 3.50 keV. Images are processed as follows: each element map is colored and overlayed to the surface morphology. The colors of the element maps are added to visualize correlation effects. The Cu signal is colored in red, the Zn signal is colored in green, and the Sn signal is colored in blue. A grain consisting of Cu, Zn, and Sn is consequently displayed as white with the gray SEM picture as background. Hence, grains where Cu, Zn, and Sn are separated (if present) are displayed in the respective color attributed to the element.

It shall also be mentioned that the method according to present invention is not only restricted to application in the $(Ag_xCu_{1-x})_2ZnSn(S_ySe_{1-y})_4$ system, but that this method may find application in all possibilities of compounds which could be formed from the $A_2BCD_4$ system, A being selected from at least one of Cu, Ag, Au; B being selected from at least one of Zn, Cd, Hg; C being selected from at least one of C, Si, Ge, Sn, Pb; and D being selected from at least one of O, S, Se, Te, Po. It is evident to the person skilled in the art that the method according to present invention can easily be adapted to each of these compounds in correspondence with its respective annealing environments and conditions.

No doubt many other effective alternatives will occur to the skilled person. It will be understood that the invention is not limited to the embodiments described herein and encompasses modifications apparent to those skilled in the art lying within the spirit and scope of the claims appended hereto.

The invention claimed is:

1. A method of manufacturing $(Ag_xCu_{1-x})_2ZnSn(S_ySe_{1-y})_4$ thin films, where x and y are independently between 0 and 1, the method comprising:
   providing a thin film comprising Ag and/or Cu, the thin film further comprising Zn; and
   annealing the thin film in an atmosphere comprising S and/or Se, and further comprising Sn, wherein the annealing comprises providing an Sn source in the presence of reactive S and/or Se external to the thin film, and heating the Sn source in a non-vacuum atmosphere to an elevated temperature and pressure in the presence of the thin film;
   wherein a vapor pressure of Sn or Sn compounds in the atmosphere essentially in contact with a surface of the thin film is higher than any partial pressure of Sn present in the thin film whereby Sn from the Sn source is provided to the thin film.

2. The method in accordance with claim 1, wherein the thin film provided prior to annealing further comprises Sn.

3. The method in accordance with claim 1, wherein the thin film provided prior to annealing further comprises S and/or Se.

4. The method in accordance with claim 1, wherein the Sn source is an Sn-containing composition further comprising S or Se.

5. The method in accordance with claim 1, wherein the step of annealing the thin film further comprises enclosing the thin film and the atmosphere in an inert enclosure.

6. The method in accordance with claim 5, wherein at least one opening is provided in the enclosure.

7. The method in accordance with claim 1, wherein the thin film is provided on a substrate.

8. The method in accordance with claim 7, wherein the substrate is molybdenum.

9. The method in accordance with claim 1, wherein the thin film comprises at least one layer comprising Zn.

10. The method in accordance with claim 1, wherein the thin film comprises at least one layer comprising Ag and/or Cu.

11. The method in accordance with claim 1, wherein the thin film comprises at least one layer comprising S and/or Se.

12. The method in accordance with claim 1, wherein the thin film comprises at least one layer comprising Sn.

13. The method in accordance with claim 1, wherein the Sn source external to the thin film further comprises a gas flow comprising Sn and reactive S/Se.

* * * * *